United States Patent [19]
Dannenberg

[11] Patent Number: 5,124,643
[45] Date of Patent: Jun. 23, 1992

[54] MOUNTING OF A POINTER TO THE ROTOR OF AN AIR CORE METER

[75] Inventor: Robert D. Dannenberg, Garrett, Ind.

[73] Assignee: Navistar International Transportation Corp., Chicago, Ill.

[21] Appl. No.: 604,832

[22] Filed: Oct. 29, 1990

[51] Int. Cl.⁵ .............................................. G01R 1/20
[52] U.S. Cl. .................................... 324/146; 29/592.1
[58] Field of Search ................ 324/146; 29/592.1, 595

[56] References Cited

U.S. PATENT DOCUMENTS

| | | | |
|---|---|---|---|
| 3,946,311 | 3/1976 | Baker et al. | 324/167 |
| 4,335,351 | 6/1982 | Faria | 324/146 |
| 4,492,920 | 1/1985 | Reenstra | 324/146 |
| 4,724,601 | 2/1988 | MacManus et al. | 29/602 R |
| 4,758,784 | 7/1988 | Baker et al. | 324/146 |

FOREIGN PATENT DOCUMENTS 0143169  6/1990  Japan .................................. 324/146

Primary Examiner—Water E. Snow
Attorney, Agent, or Firm—Dennis K. Sullivan

[57] ABSTRACT

The pointer of an air-core meter instrumentation gauge comprises a driven hub via which the pointer is separably attached to a driving hub on the rotor of the air core meter movement. The driving hub is press-fitted to the rotor in proper circumferential alignment so that when the pointer is attached, the pointer will be inherently properly circumferentially oriented too. This is accomplished by providing a keyed connection between the driving and driven hubs such that the pointer can be assembled to the driving hub in only one particular circumferential orientation. The hubs also have a snap-together catch feature that is additional to the keyed connection.

19 Claims, 2 Drawing Sheets

FIGURE 2
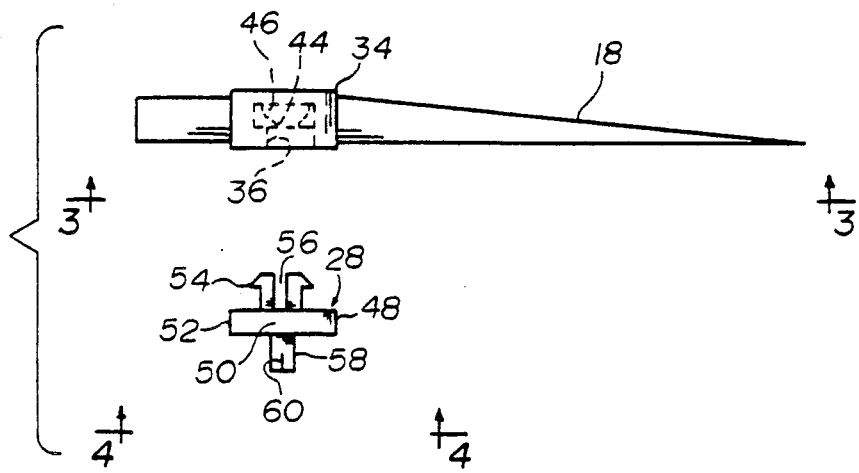
FIGURE 3
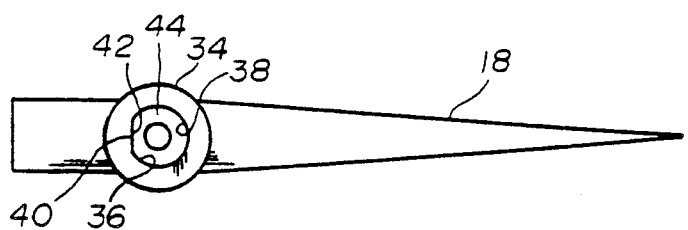
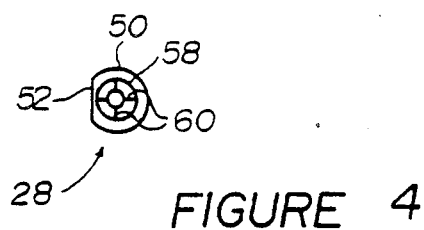
FIGURE 4

MOUNTING OF A POINTER TO THE ROTOR OF AN AIR CORE METER

FIELD OF THE INVENTION

This invention relates generally to instrumentation gauges of the type which comprise an air core meter having a pointer on its rotor.

BACKGROUND AND SUMMARY OF THE INVENTION

Air core meters are advantageously used as instrumentation gauges to provide readings of parameters of interest that are derived from sensors. For example, instrumentation gauges of this type are commonly found in the instrument clusters of automotive vehicles.

While such gauges are quite reliable and accurate in use, the process of making them requires particular care in assembling the pointer to the rotor. The pointer must be carefully pressed onto the rotor contemporaneously with an energization of the meter that produces a desired angular positioning of the rotor. If any twist occurs while the pointer is being pressed onto the rotor, the pointer must be pulled off and the step of assembling the pointer to the rotor must be re-attempted.

It is typical practice in the industry for the gauge manufacturer to perform the step of assembling the pointers to the air core meters in this manner. Thus, an automotive vehicle manufacturer typically orders from the gauge manufacturer gauges that include the pointers. However, this course of dealing imposes certain restrictions on the automotive vehicle manufacturer. One restriction resides in the styling of instrument clusters of automotive vehicles; another in spare parts inventory.

An example of the effect of such restrictions is illustrated by the case of a speedometer. Presently an air core gauge used for a specific speedometer application must be styled as a unique stand-alone assembly that has a specific graphic overlay. For service, it is necessary that the same unique stand-alone assembly be inventoried as a replacement speedometer. Considering the fact that there are many unique speedometer applications each requiring a unique stand-alone assembly, one can appreciate that spare parts inventories must include many different models and part numbers for spare speedometers. That the magnitude of this situation is quite large is perceived when one recognizes that many automotive vehicles contain more air core gauges than just merely speedometers.

For example, many vehicles also contain air core meter type tachometers as unique stand-alone assemblies. Yet the only difference between an air-core type speedometer and an air core type tachometer may be the different indicia on their respective graphic overlays. In the case of sensor-driven air core gauges, the only difference between two gauges, other than possibly a difference in graphic overlays or pointer styling, may be the values of their respective calibrating resistors for matching each to a respective sensor. Another potential area of difference may arise due to the fact that some air core meters are sensor-driven while others are sine-cosine type.

The present invention will greatly simplify the complications that now exist due to the many unique assemblies that must be inventoried. Briefly, the invention relates to a new and unique mounting of the pointer on the rotor of an air core type instrumentation gauge. A driving hub is fitted to the rotor of the air core meter movement such that the hub is at a proper circumferential position on the rotor. The pointer has a driven hub which can snap on and off the driving hub and which is circumferentially keyed to the driving hub so that the pointer is properly circumferentially positioned to the rotor. This mounting allows the pointer to be assembled to the air core meter after a graphic overlay has been disposed over the meter. Thus it becomes possible for the automotive vehicle manufacturer to order from the gauge manufacturer, air core meters which have only the driving hub, and not the pointer, mounted on the rotor. Automotive vehicle manufacturers and service organizations can use these "pointerless" meters in any applications that are appropriate, and they themselves assemble the pointers to the driving hubs. Inventory and part numbering requirments are simplified, because rather than having to stock a unique gauge for each specific application, it is possible for a particular "pointerless" meter to be used in any one of a number of different gauges which may differ only in graphic overlay or pointer styling. If a meter in an existing gauge needs to be replaced, the pointer is simply unsnapped from the driving hub of the meter that is being replaced, that meter is replaced by another, and the pointer is snapped onto the driving hub of the latter meter with full assurance that the pointer is properly circumferentially oriented to the meter's rotor. It is contemplated that only two types of meters need be stocked for service, namely sensor-driven and sine/cosine. When the movement of an existing gauge is being replaced, the graphic overlay and pointer of the gauge can be re-used.

The invention is especially conducive to the integration of multiple gauges into an instrumentation display which has a single graphic overlay. Such a display can be fabricated without an individual border surrounding each gauge thereby allowing the graphic legends to be made larger for better readability and styling appearance. Whenever an individual gauge requires replacement of a movement, its pointer is simply unsnapped from the hub of the movement being replaced and thereafter snapped on the hub of the new movement.

Further features and advantages of the invention, along with those already mentioned, will be seen in the ensuing description which is accompanied by drawings. The drawings disclose a presently preferred embodiment of the invention according to the best mode contemplated at the present time for carrying out the invention.

BRIEF DESCRIPTION OF THE DRAWINGS

FIG. 2 is a side elevational view showing a pointer mounting in greater detail and in disassembled condition.

FIG. 3 is a bottom plan view as taken in the direction of arrows 3—3 in FIG. 2.

FIG. 4 is a bottom plan view as taken in the direction of arrows 4—4 in FIG. 2.

DESCRIPTION OF THE PREFERRED EMBODIMENT

Figure 1:
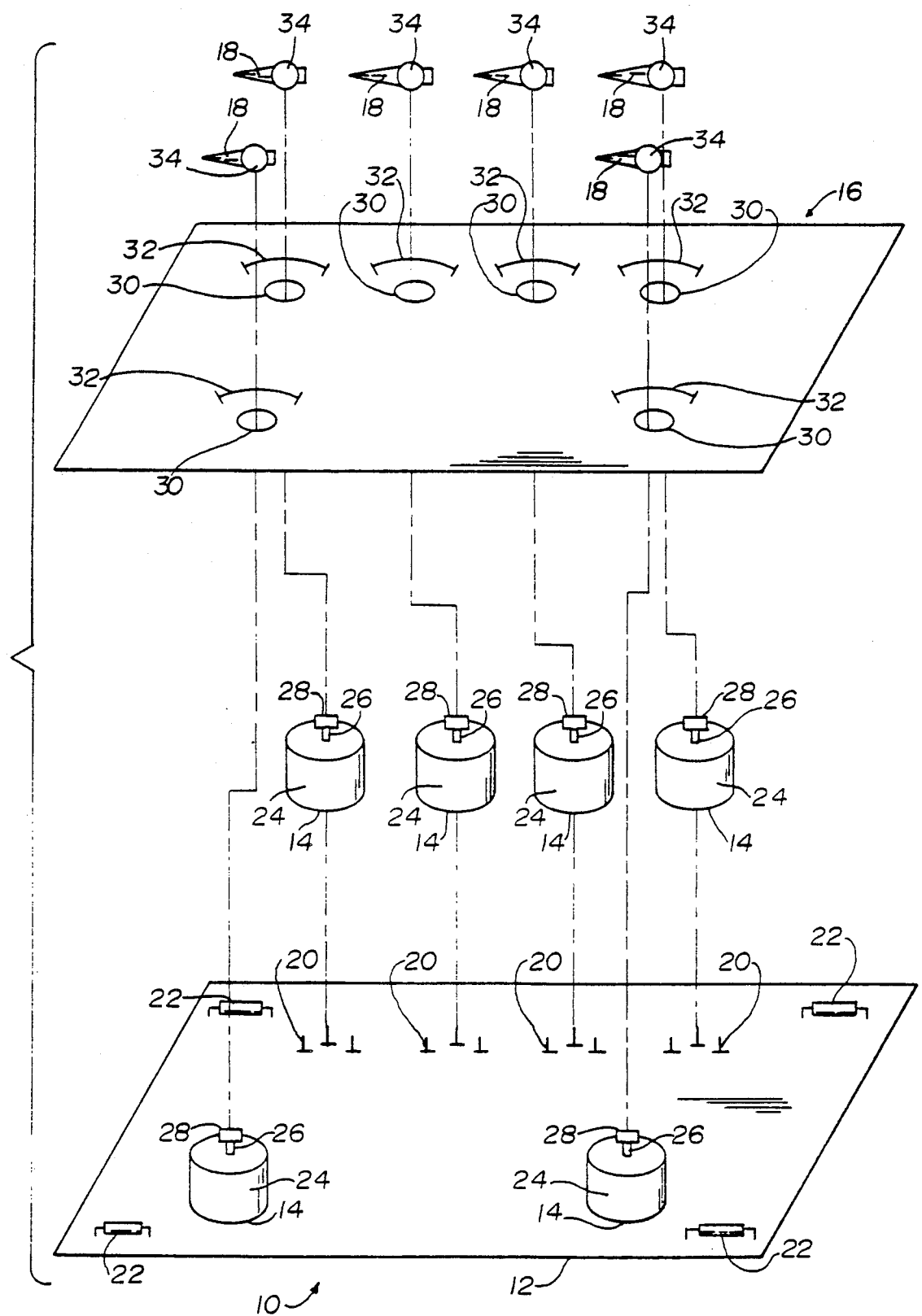
FIG. 1 is an exploded perspective view, somewhat schematic in nature, of a multiple gauge instrumentation display containing air core meters having pointer mountings according to principles of the invention.

FIG. 1 shows an exemplary instrumentation display 10 comprising a printed circuit board assembly 12, air core meter movements 14, a single sheet graphic overlay 16, and pointers 18. The illustrated movements are of the plug-in type comprising a pattern of electrical terminals (not visible in the drawing) which make plug connection with a pattern of mating terminals 20 on printed circuit board assembly 12. FIG. 1 shows the lower right and lower left movements plugged into their terminals 20 while the upper row of four movements are shown disconnected from printed circuit board assembly 12. The four corner movements are the sensor-driven type, and a corresponding resistor 22 mounted on the printed circuit board assembly is associated in circuit relationship with each of these movements to provide proper impedance matching between the corresponding movement 14 and the corresponding sensor (not shown) which drives the movement. The middle two movements in the upper row are sine-cosine type.

Each movement 14 has a cylindrical body 24. A rotor 26 protrudes coaxially from one axial end of each body 24. The interior of each body 24 contains a selectively energizable electromagnetic coil means for producing a magnetic field vector that is selectively positionable about an axis in accordance with the electrical input that is delivered to the movement's terminals by the corresponding terminals 20. A magnet means is attached to the rotor internally of body 24, and this magnet means aligns with the magnetic field vector that is produced by the movement's electromagnetic coil means. Hence the rotary position that is assumed by rotor 26 is directly related to the magnetic field vector, and hence to the electrical input to the movement. This description of the internal construction of movement 14 has been generic since there are many species of air core meter movements to which the present invention is applicable.

In accordance with principles of the present invention, the distal end of each rotor 26 contains a driving hub 28. The body 24, rotor 26, and driving hub 28 of each movement constitute a "pointerless" movement. After all six "pointerless" movements have been plugged into printed circuit board assembly 12, graphic overlay 16 is disposed in overlying relation to them. Graphic overlay 16 contains a pattern of holes 30 that allow the driving hubs 28 to pass through to the face (upper) side of the overlay. With the driving hubs so disposed, pointers 18 are assembled to them. The face side of the overlay contains various indicia 32, such as a scale, against which the positions of the pointers can be read by an observer.

Details of a driving hub and pointer are presented in FIGS. 2-4. Each pointer 18 is generally needle-shaped and contains an integral driven hub 34 near its blunt end. The pointer and its integral driven hub are a single plastic part for example. Driven hub 34 contains a socket 36 that is open toward driving hub 28. Socket 36 comprises particular constructional features for coaction with driving hub 28. One of these features is a keying means that serves to couple the driving and driven hubs for rotation in unison. Another is a catch receiving means that provides for the snap-on attachment of the pointer to the driving hub.

The keying means of socket 36 comprises an inside diameter circular cylindrical walled surface 38 from a particular circumferential location on which an integral key 40 projects radially inwardly. The radially inner surface of key 40 is a flat planar wall surface 42 that lies on a chord of the inside diameter of surface 38. This keying means of socket 36 is immediately adjacent the socket's entrance.

The catch receiving means of socket 36 is disposed coaxial with the keying means, but more interiorly of the socket's entrance than the keying means, and comprises a radially inwardly projecting lip 44 that separates the keying means from a catch-receiving space 46 at the innermost end of the socket.

Driving hub 28 comprises a keyed means in the form of a chordally truncated cylinder 48. Cylinder 48 has a side wall that consists of a cylindrically circularly shaped portion 50 and a flat planar portion 52. Portion 52 lies on a chord of the circle that is defined by the outside diameter of portion 50. The truncation of cylinder 48 in this way defines a keyed means in the form of a recess that projects radially inwardly of the circle defined by the outside diameter portion 50 and that receives the keying means of socket 36. Truncated cylinder 48 is dimensioned for a mating fit with the inside of socket 36 such that rotary motion of the driving hub will be transmitted to the driven hub to thereby position the pointer about the coaxis of the driving and driven hubs.

Driving hub 28 also comprises a catch means at one axial end of truncated cylinder 48. This catch means is in the form of a button 54 containing plural radial slots 56. Button 54 is dimensioned such that during assembly of the pointer to the driving hub, the initial engagement of the button by lip 44 will cause the button to circumferentially contract to allow the button to pass and enter space 46 where it can resiliently expand back to its uncontracted state. The button thereby provides a catch that engages the socket to axially catch the pointer. By making the driving and driven hubs of suitable material such as a suitable plastic, the pointer can have a snap-on, snap-off type of separable connection to the driving hub. It should be appreciated that in order for the snap-on attachment to be made, it is necessary that the pointer be properly circumferentially aligned with the driving hub so that the truncated cylinder 48 can enter the socket. Thus the driving hub may be considered to constitute a non-circular shaft that snaps into and catches with a non-circular socket in a unique circumferential orientation.

On the opposite axial end of truncated cylinder 48 is a socket 58 which may include one or more slots 60 in its side wall extending from the socket's distal end. Socket 58 is open toward the rotor and provides for the press-fitting of the driving hub onto the rotor 26. Socket 58 is coaxial with the driving and driven hubs so that the latter are coaxial with the rotor.

The fabrication process contemplates that the driving hub will be assembled to the rotor before the pointer is assembled to the driving hub. Thus the driving hub will be assembled in accordance with proper procedures to assure that it is properly circumferentially aligned to the rotor so that the movement will provide proper pointer positioning when the pointer is assembled. If it ever becomes necessary to disassemble an instrumentation gauge, a pointer is merely snapped off the driving hub. The pointer is snapped on at re-assembly, and since the driving hub already has the proper circumferential alignment on the rotor, the keying feature of the invention will assure that the pointer will be properly circumferentially aligned to the rotor too. Accordingly, the invention can provide the many advantages heretofore mentioned.

While a presently preferred embodiment of the invention has been illustrated and described, the intellectual property is not necessarily limited to the specific details that have been presented.

What is claimed is:

1. An air core meter comprising a body; selectively energizable electromagnetic coil means on said body for producing a magnetic field vector that is selectively positionable about an axis in accordance with the energization of said electromagnetic coil means; a rotor, including magnet means, arranged on said body for rotary motion that follows the magnetic field vector produced by the selective energization of said electromagnetic coil means; and a pointer that is positioned by the rotary motion of said rotor to indicate the selective energization of said electromagnetic coil means; characterized in that, a driving hub is disposed on said rotor for rotary motion in unison with said rotor, a driven hub is disposed on said pointer, and means separably units said driving and driven hubs such that the rotary motion of said driving hub is transmitted to said driven hub to thereby position said pointer, and characterized further in that said means that separably unites said driving and driven hubs comprises keying means on one of said hubs and keyed means on the other of said hubs, and said keying means is received by said keyed means in a particular relative circumferential orientation of said pointer to said rotor to provide for the pointer to properly indicate the selective energization of said electromagnetic coil means.

2. An air core meter as set forth in claim 1 characterized further in that said keying means comprises a radial projection and said keyed means comprises a complementary shaped radial recess.

3. An air core meter as set forth in claim 2 characterized further in that said radial projection is disposed to project radially inwardly from an inside diameter of said one hub and said radial recess is disposed to project radially inwardly from an outside diameter of said other hub.

4. An air core meter as set forth in claim 3 characterized further in that said one hub is said driven hub and said other hub is said driving hub.

5. An air core meter as set forth in claim 1 characterized further in that said driving hub is a separate element that is separably united with said rotor.

6. An air core meter as set forth in claim 1 characterized further in that said driven hub is integral with said pointer such that both said pointer and said driven hub are a single element.

7. An air core meter as set forth in claim 1 characterized further in that said driving hub comprises a socket that has a press-fit on said rotor.

8. An air core meter as set forth in claim 1 characterized further in that said means that separably units said driving and driven hubs comprises a non-circular shaft on one of said hubs that is received in a non-circular socket on the other of said hubs, the non-circularities of said shaft and socket constituting said keying means and said keyed means.

9. An air core meter as set forth in claim 8 characterized further in that said one hub is said driving hub and said other hub is said driven hub.

10. An air core meter as set forth in claim 1 characterized further in that said means that separably unites said driving and driven hubs includes resiliently deflectable catch means on one of said hubs that serves to releaseably catch the other of said hubs.

11. An air core meter as set forth in claim 10 characterized further in that said catch means comprises a resiliently deformable button on said driving hub, and said other hub comprises a catch means receiving socket within which said button is disposed.

12. An air core meter comprising a body; selectively energizable electromagnetic coil means on said body for producing a magnetic field vector that is selectively positionable about an axis in accordance with the energization of said electromagnetic coil means; a rotor, including magnet means, arranged on said body for rotary motion that follows the magnetic field vector produced by the selective energization of said electromagnetic coil means; and a pointer that is positioned by the rotary motion of said rotor to indicate the selective energization of said electromagnetic coil means; characterized in that, a driving hub is disposed on said rotor for rotary motion in unison with said rotor, an operative coupling is provided between said hub and said pointer for transmitting from said hub to said pointer the rotary motion that is imparted to said hub by said rotor, and said operative coupling comprises a non-circular shaft on one of said hub and said pointer and a non-circular socket on the other of said hub and said pointer receiving said shaft, the non-circularities of said shaft and socket constituting a keying means and a keyed means that provide for said pointer to be coupled to said hub in a particular relative circumferential orientation of said pointer to said hub to provide for the pointer to properly indicate the selective energization of said electromagnetic coil means.

13. An air core meter as set forth in claim 12 characterized further in that said shaft and said socket are disposed coaxial with said rotor.

14. An air core meter as set forth in claim 13 characterized further in that said socket is integral with said pointer such that both said pointer and said socket are a single element.

15. An air core meter as set forth in claim 13 characterized further in that one of said shaft and said socket includes resiliently deflectable catch means that serves to releaseably catch the other of said shaft and said socket.

16. An air core meter comprising a body; selectively energizable electromagnetic coil means on said body for producing a magnetic field vector that is selectively positionable about an axis in accordance with the energization of said electromagnetic coil means; a rotor, including magnet means, arranged on said body for rotary motion that follows the magnetic field vector produced by the selective energization of said electromagnetic coil means; and a pointer that is positioned by the rotary motion of said rotor to indicate the selective energization of said electromagnetic coil means; characterized in that, a driving hub is disposed on said rotor for rotary motion in unison with said rotor, there is provided means providing axial snap-on attachment of said pointer to said driving hub, and means, including keying means on one of said driving hub and pointer and keyed means on the other of said driving hub and pointer, providing transmission of motion imparted to said driving hub by said rotor from said driving hub to said pointer, and said keying means is received by said keyed means in a particular relative circumferential orientation of said pointer to said driving hub to provide for the pointer to properly indicate the selective energization of said electromagnetic coil means.

17. An air core meter as set forth in claim 16 characterized further in that said pointer comprises a driven hub that is coaxial with said driving hub.

18. An air core meter as set forth in claim 17 characterized further in that said driven hub is integral with said pointer such that both said pointer and said driven hub are a single element.

19. A method of making an instrumentation gauge from an air core meter movement, a graphic overlay, and a pointer comprising: assembling onto a rotor of the air core meter movement in a particular circumferential orientation a driving hub that has one of a circumferential keying means and a circumferential keyed means; providing on said pointer a driven hub that has the other of said circumferential keying means and said circumferential keyed means; disposing the graphic overlay over the air core meter movement while leaving the driving hub available for reception of the driven hub; and assembling the driven hub onto the driving hub in proper circumferential orientation by circumferentially aligning said keying means and said keyed means to unit and key the two hubs for rotary motion in unison with said rotor.

* * * * *